United States Patent
Lee et al.

(10) Patent No.: US 9,722,624 B2
(45) Date of Patent: Aug. 1, 2017

(54) SEMICONDUCTOR DEVICE COMPRISING SUCCESSIVE APPROXIMATION REGISTER ANALOG TO DIGITAL CONVERTER WITH VARIABLE SAMPLING CAPACITOR

(71) Applicants: Jong-Woo Lee, Seoul (KR); Seung-Hyun Oh, Seoul (KR); Thomas Byung-Hak Cho, Gyeonggi-do (KR)

(72) Inventors: Jong-Woo Lee, Seoul (KR); Seung-Hyun Oh, Seoul (KR); Thomas Byung-Hak Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/074,447

(22) Filed: Mar. 18, 2016

(65) Prior Publication Data
US 2016/0308549 A1   Oct. 20, 2016

(30) Foreign Application Priority Data

Apr. 20, 2015 (KR) .................. 10-2015-0055021
Jun. 23, 2015 (KR) .................. 10-2015-0089070

(51) Int. Cl.
*H03M 1/12* (2006.01)
*H03M 1/46* (2006.01)

(52) U.S. Cl.
CPC ......... *H03M 1/468* (2013.01); *H03M 1/1245* (2013.01)

(58) Field of Classification Search
CPC ........ H03M 1/804; H03M 1/468; H03M 1/38; H03M 1/46; H03M 1/462; H03M 1/68
USPC .............. 341/118, 120, 122, 155, 172, 150
See application file for complete search history.

(56) References Cited

U.S. PATENT DOCUMENTS

| | | |
|---|---|---|
| 6,940,438 B2 | 9/2005 | Koe et al. |
| 7,199,746 B1 | 4/2007 | Chowdhury et al. |
| 7,558,550 B2 | 7/2009 | Brobston et al. |
| 7,821,441 B2 | 10/2010 | Westwick et al. |

(Continued)

*Primary Examiner* — Linh Nguyen
(74) *Attorney, Agent, or Firm* — The Farrell Law Firm, P.C.

(57) ABSTRACT

A semiconductor device and operating method thereof are provided. The semiconductor device includes a mode controller configured to output a control signal of a first level in a first mode, and output a control signal of a second level that is different from the first level in a second mode that is different from the first mode; and a successive approximation register analog-to-digital converter (SAR ADC) configured to convert an analog input signal into a digital output signal using a plurality of variable sampling capacitors, wherein each of the plurality of variable sampling capacitors comprises a first sampling capacitor having a first capacitance, and a second sampling capacitor having a second capacitance, wherein, in the first mode, the SAR ADC is configured to receive the control signal of the first level and connect the first sampling capacitor and the second sampling capacitor to either of a first voltage and a second voltage that is different from the first voltage to convert the analog input signal into the digital output signal, and wherein, in the second mode, the SAR ADC is configured to receive the control signal of the second level and connect any one of the first sampling capacitor and the second sampling capacitor to either of the first voltage and the second voltage to convert the analog input signal into the digital output signal.

19 Claims, 18 Drawing Sheets

(56) References Cited

U.S. PATENT DOCUMENTS

| | | | |
|---|---|---|---|
| 7,928,871 B2 | 4/2011 | Aruga et al. | |
| 8,013,770 B2 | 9/2011 | Yang et al. | |
| 8,102,292 B1* | 1/2012 | Van Ess | H03M 3/426 |
| | | | 341/143 |
| 8,395,538 B2 | 3/2013 | Das et al. | |
| 8,427,351 B2 | 4/2013 | Chou et al. | |
| 8,456,348 B2* | 6/2013 | Kuo | H03M 1/466 |
| | | | 341/150 |
| 8,508,400 B2* | 8/2013 | Wu | H03M 1/0673 |
| | | | 341/118 |
| 8,552,897 B1 | 10/2013 | Hurrell | |
| 8,860,600 B1* | 10/2014 | Yang | H03M 1/466 |
| | | | 341/150 |
| 8,981,973 B2* | 3/2015 | Kumar | H03M 1/0617 |
| | | | 341/118 |
| 2003/0231130 A1* | 12/2003 | Confalonieri | H03M 1/181 |
| | | | 341/172 |
| 2006/0001563 A1 | 1/2006 | Kearney | |
| 2007/0139243 A1* | 6/2007 | Chowdhury | H03M 1/462 |
| | | | 341/155 |
| 2009/0161798 A1* | 6/2009 | Wong | H04B 1/16 |
| | | | 375/340 |
| 2009/0261998 A1* | 10/2009 | Chae | H03M 3/46 |
| | | | 341/118 |
| 2013/0015996 A1* | 1/2013 | Furuta | H03M 1/06 |
| | | | 341/172 |
| 2013/0076553 A1* | 3/2013 | Kuo | H03M 1/466 |
| | | | 341/172 |
| 2015/0002321 A1* | 1/2015 | Zhou | H03M 1/0617 |
| | | | 341/118 |
| 2015/0108483 A1* | 4/2015 | Lee | G02F 1/133512 |
| | | | 257/71 |

\* cited by examiner

1200

1300

1400

SEMICONDUCTOR DEVICE COMPRISING SUCCESSIVE APPROXIMATION REGISTER ANALOG TO DIGITAL CONVERTER WITH VARIABLE SAMPLING CAPACITOR

PRIORITY

This application claims priority under 35 U.S.C. §119(a) to a Korean Patent Application filed on Apr. 20, 2015 in the Korean Intellectual Property Office and assigned Serial No. 10-2015-0055021 and to a Korean Patent Application filed on Jun. 23, 2015 in the Korean Intellectual Property Office and assigned Serial No. 10-2015-0089070, the entire disclosures of each of which are incorporated herein by reference.

BACKGROUND

1. Field of the Disclosure

The present disclosure relates generally to a semiconductor device, and more particularly, to a semiconductor device including a successive approximation register analog-to-digital converter (SAR ADC) of a variable sampling capacitor.

2. Description of the Related Art

An ADC is used to generate a sequence of digital codes that represent each signal level of an analog signal.

Recently, a successive approximation method which repeatedly performs a digital-to-analog conversion and compares data to determine the bits of a digital code has been disclosed.

SUMMARY

An aspect of the present disclosure provides a semiconductor device that can maintain an input impedance of a SAR ADC at a constant level regardless of a frequency of an input signal.

Another aspect of the present disclosure provides a semiconductor device with improved signal to noise and distortion ratio (SNDR).

Another aspect of the present disclosure provides a semiconductor device that has improved operating characteristics and can be miniaturized.

Another aspect of the present disclosure provides a first capacitor that may be equal to a second capacitor.

Another aspect of the present disclosure provides an analog input signal that may have a first frequency in a first mode and a second frequency that is greater than the first frequency in a second mode.

Another aspect of the present disclosure provides a plurality of variable sampling capacitors that may comprise a plurality of first variable sampling capacitors, a bridge capacitor, and a plurality of second variable sampling capacitors, where the first variable sampling capacitors may have a binary-weighted structure, and the second variable sampling capacitors may have a thermometer code structure.

Another aspect of the present disclosure provides a semiconductor device that may further include a first interlayer insulating film in which a first sampling capacitor is formed, and a second interlayer insulating film in which a second sampling capacitor is formed, wherein the second interlayer insulating film may be disposed on the first interlayer insulating film.

Another aspect of the present disclosure provides a first capacitance that may be greater than a second capacitance.

Another aspect of the present disclosure provides a semiconductor device that may further include a decimation filter that filters a converted digital output signal in a first mode.

Another aspect of the present disclosure provides a plurality of variable sampling capacitors that may include a plurality of first variable sampling capacitors, a bridge capacitor, and a plurality of second variable sampling capacitors, where the first and second variable sampling capacitors may have any one of a binary-weighted structure and a thermometer code structure.

Another aspect of the present disclosure provides a plurality of variable sampling capacitors that may have any one of a binary-weighted capacitor structure and a thermometer code structure.

Another aspect of the present disclosure provides a first analog input signal that may have a first frequency, and a second analog input signal that may have a second frequency that is greater than the first frequency.

Another aspect of the present disclosure provides a first sampling capacitor that may include a plurality of first sampling capacitors that has 2nC (e.g. where n is a natural number and C is a rational number) as a capacitance value, and a second sampling capacitor may include a plurality of second sampling capacitors that has nC as a capacitance value.

Another aspect of the present disclosure provides a SAR controller that may connect each of a plurality of first sampling capacitors to any one of a first voltage and a second voltage that is different from the first voltage, when converting a first analog input signal into a first digital output signal, and the SAR controller may connect each of a plurality of second sampling capacitors to any one of the first voltage and the second voltage, when converting a second analog input signal into a second digital output signal.

Another aspect of the present disclosure provides a plurality of first sampling capacitors that may include a plurality of third sampling capacitors, a bridge capacitor, and a plurality of fourth sampling capacitors, where the plurality of third sampling capacitors may have a binary-weighted structure, and the plurality of fourth sampling capacitors may have a thermometer code structure.

Another aspect of the present disclosure provides an output unit that may include a multiplexer that outputs an output of a decimation filter when a control signal of a first level is applied, and outputs an output of a SAR controller when a control signal of a second level that is different from the first level is applied.

Another aspect of the present disclosure provides that each of variable sampling capacitors may further include a first switching element that is controlled by a switching signal output from a SAR controller and connects a first sampling capacitor to one of a first voltage and a second voltage, and a second switching element that is controlled by a switching signal and a control signal and connects a second sampling capacitor to one of the first voltage and the second voltage.

Another aspect of the present disclosure provides a semiconductor device that may further include an AND gate that performs an AND arithmetic operation of a switching signal and a control signal, and provides a result of the AND arithmetic operation to a second switching element.

Another aspect of the present disclosure provides a SAR controller that may control each of variable sampling capacitors so that first and second sampling capacitors are connected to one of a first voltage and a second voltage when a control signal of a first level is applied, and the SAR controller may control each of the variable sampling capacitors so that one of the first and second sampling capacitors is connected to one of the first voltage and the second voltage when a control signal of a second level that is different from the first level is applied.

Another aspect of the present disclosure provides a semiconductor device that may further include a decimation filter that filters a first digital output signal and does not filter a second digital signal.

Another aspect of the present disclosure provides a capacitance of a first sampling capacitor that may be equal to a capacitance of a second sampling capacitor.

Another aspect of the present disclosure provides a first analog input signal that may have a first frequency, and a second analog input signal that may have a second frequency that is greater than the first frequency.

According to an aspect of the present disclosure, there is provided a semiconductor device. The semiconductor device includes a mode controller configured to output a control signal of a first level in a first mode, and output a control signal of a second level that is different from the first level in a second mode that is different from the first mode, and a SAR ADC configured to convert an analog input signal into a digital output signal using a plurality of variable sampling capacitors, wherein each of the plurality of variable sampling capacitors comprises a first sampling capacitor having a first capacitance, and a second sampling capacitor having a second capacitance, wherein, in the first mode, the SAR ADC is configured to receive the control signal of the first level, and connect the first sampling capacitor and the second sampling capacitor to either of a first voltage and a second voltage that is different from the first voltage to convert the analog input signal into the digital output signal, and wherein, in the second mode, the SAR ADC is configured to receive the control signal of the second level and connect any one of the first sampling capacitor and the second sampling capacitor to either of the first voltage and the second voltage to convert the analog input signal into the digital output signal.

According to another aspect of the present disclosure, there is provided a semiconductor device. The semiconductor device includes a comparator having an input node, a SAR controller configured to convert a first analog input signal into a first digital output signal, by adjusting a voltage of the input node using a first sampling capacitor if an analog input signal is the first analog input signal, and convert a second analog input signal that is different from the first analog input signal into a second digital output signal, by adjusting the voltage of the input node using a second sampling capacitor having a capacitance that is less than a capacitance of the first sampling capacitor if the analog input signal is the second analog input signal, and a decimation filter configured to filter the first digital output signal and not filter the second digital output signal.

According to another aspect of the present disclosure, there is provided a semiconductor device. The semiconductor device includes a plurality of variable sampling capacitors, wherein each of the plurality of variable sampling capacitors includes a first sampling capacitor having a first capacitance, and a second sampling capacitor having a second capacitance, a comparator having a first input node connected to the plurality of variable sampling capacitors and a second input node connected to a comparison voltage, a SAR controller configured to receive an output of the comparator, and connect each of the plurality of variable sampling capacitors to one of a first voltage and a second voltage that is different from the first voltage, a decimation filter connected to the SAR controller, and an output unit configured to output any one of an output of the decimation filter and an output of the SAR controller depending on a control signal.

According to another aspect of the present disclosure, there is provided a semiconductor device. The semiconductor device includes an input port, an output port, and a SAR ADC configured to convert an analog input signal input to the input port into a digital output signal using a plurality of variable sampling capacitors, and output the digital output signal to the output port, wherein each of the plurality of variable sampling capacitors comprises a first sampling capacitor that is formed on a substrate and has a first capacitance, and a second sampling capacitor that is formed on the first sampling capacitor and has a second capacitance, wherein the SAR ADC is configured to convert a first analog input signal into a first digital output signal using the first sampling capacitor and the second sampling capacitor if the analog input signal is the first analog input signal, and convert a second analog input signal into a second digital output signal using one of the first sampling capacitor and the second sampling capacitor if the analog input signal is the second analog input signal that is different from the first analog input signal.

According to another aspect of the present disclosure, there is provided an operating method of a semiconductor device. The operating method of a semiconductor device includes outputting, by a mode controller, a control signal of a first level in a first mode and a control signal of a second level that is different from the first level in a second mode that is different from the first mode; and converting, by a successive approximation register analog-to-digital converter (SAR ADC), an analog input signal into a digital output signal using a plurality of variable sampling capacitors, wherein each of the plurality of variable sampling capacitors comprises a first sampling capacitor having a first capacitance, and a second sampling capacitor having a second capacitance, wherein, in the first mode, the SAR ADC is configured to receive the control signal of the first level and connect the first sampling capacitor and the second sampling capacitor to either of a first voltage and a second voltage that is different from the first voltage to convert the analog input signal into the digital output signal, and wherein, in the second mode, the SAR ADC is configured to receive the control signal of the second level and connect any one of the first sampling capacitor and the second sampling capacitor to either of the first voltage and the second voltage to convert the analog input signal into the digital output signal.

According to another aspect of the present disclosure, there is provided an operating method of a semiconductor device. The operating method of a semiconductor device includes converting, by a successive approximation register (SAR) controller, a first analog input signal into a first digital output signal, by adjusting a voltage of an input node using a first sampling capacitor if an analog input signal is the first analog input signal; converting, by the SAR, a second analog input signal that is different from the first analog input signal into a second digital output signal, by adjusting the voltage of the input node using a second sampling capacitor having a capacitance that is less than a capacitance of the first sampling capacitor if the analog input signal is the second analog input signal; filtering, by a decimation filter, the first digital output signal; and not filtering, by the decimation filter, the second digital output signal.

BRIEF DESCRIPTION OF THE DRAWINGS

The above and other aspects, features, and advantages of the present disclosure will be more apparent from the following description, taken in conjunction with the accompanying drawings, in which.

DETAILED DESCRIPTION OF EMBODIMENTS OF THE PRESENT DISCLOSURE

Figure 1:
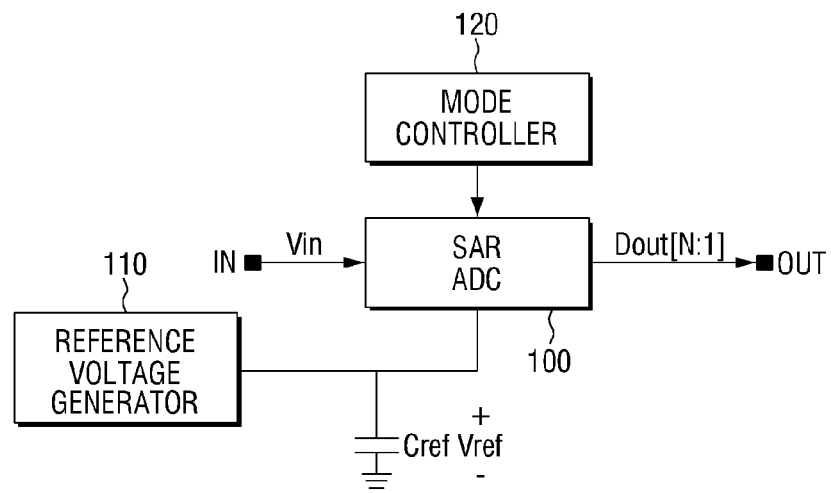
FIG. 1 is a block diagram of a semiconductor device according to an embodiment of the present disclosure.

Advantages and features of the present disclosure and methods of accomplishing the same may be understood more readily by reference to the following detailed description of embodiments of the present disclosure and the accompanying drawings. The present disclosure may, however, be embodied in many different forms and should not be construed as being limited to the embodiments of the present disclosure set forth herein. Rather, these embodiments are provided so that the present disclosure is thorough and complete and fully conveys the present disclosure to those skilled in the art, and the scope of the present disclosure is only defined by the appended claims and their equivalents. In the accompanying drawings, the thicknesses of layers and regions are exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, components, region, layer or section. Thus, a first element, component, region, layer or section described below could be referred to as a second element, component, region, layer or section without departing from the present disclosure.

Spatially relative terms, such as "beneath," "below," "lower," "under," "above," "upper" and the like, may be used herein to describe one element or feature's relationship to another element(s) or feature(s) as illustrated in the accompanying drawings. It will be understood that the spatially relative terms are intended to encompass different orientations of a semiconductor device in use or operation in addition to the orientation depicted in the accompanying drawings. For example, if a semiconductor device in the accompanying drawings is turned over, elements described as "below" or "beneath" or "under" other elements or features would then be oriented "above" the other elements or features. Thus, the terms "below" and "under" can encompass both an orientation of above and below. A semiconductor device may be otherwise oriented (e.g., rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terms used herein are for the purpose of describing an embodiment of the present disclosure only and is not intended to limit the present disclosure. As used herein, the singular forms "a," "an" and "the" are intended to include the plural forms as well, unless the context clearly indicates otherwise. It will be further understood that the terms "comprises" and/or "comprising," when used in the present disclosure, indicate the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms used herein have the same meanings as commonly understood by one of ordinary skill in the art to which the present disclosure belongs. It will be further understood that terms, such as those defined in commonly used dictionaries, should be interpreted as having meanings that are consistent with their meanings in the context of the relevant art and/or the present disclosure and should not be interpreted in an idealized or overly formal sense unless expressly so defined herein.

FIG. 1 is a block diagram of a semiconductor device according to an embodiment of the present disclosure.

Referring to FIG. 1, a semiconductor device 1 includes a SAR ADC 100, a reference voltage generator 110 and a mode controller 120.

The SAR ADC 100 may convert an analog input signal Vin supplied to an input port IN into a digital output signal Dout of N bits (e.g. N is a natural number) through a successive approximation method.

For example, after the SAR ADC 100 receives the input of the analog input signal Vin and determines each bit of the N-bit digital output signal Dout through the successive approximation method, the SAR ADC 100 may output the bits.

The reference voltage generator 110 may generate a reference voltage required for the conversion operation of the SAR ADC 100. The reference voltage Vref thus generated through the reference voltage generator 110 may be stored in a reference voltage capacitor Cref. The reference voltage Vref stored in the reference voltage capacitor Cref may be used by the SAR ADC 100 to determine each bit of the N-bit digital output signal Dout.

By providing the reference voltage Vref to the SAR ADC 100 through the reference voltage capacitor Cref, the operation stability of the SAR ADC 100 may be improved as compared to a case where the reference voltage generator 110 is directly connected to the SAR ADC 100.

Although a configuration in which the reference voltage Vref is provided to the SAR ADC 100 through the reference voltage capacitor Cref is described, the present disclosure is not limited thereto, and the reference voltage Vref may be provided to the SAR ADC 100 in another manner which is not illustrated.

The mode controller 120 may output a control signal HR in a first mode, and may not output the control signal HR in a second mode. The semiconductor device 1 according to an embodiment of the present disclosure may operate in the first mode and the second mode, depending on the analog input signal Vin that is provided to the input port IN.

For example, when the analog input signal Vin provided to the input port IN is a first analog input signal, the semiconductor device 1 may operate in the first mode, and when the analog input signal Vin provided to the input port IN is a second analog input signal, the semiconductor device 1 may operate in the second mode.

In an embodiment of the present disclosure, for example, the first analog input signal may be a signal having a first frequency, and the second analog input signal may be a signal having a second frequency that is greater than the first frequency.

In an embodiment of the present disclosure, the first analog input signal, for example, may be an analog input signal based on a second generation (2G) or third generation (3G) wireless communication method, and the second analog input signal, for example, may be an analog input signal based on a fourth generation (4G) wireless communication method.

Although the mode controller 120 is illustrated separately from the SAR ADC 100, the present disclosure is not limited thereto. In an embodiment of the present disclosure, the mode controller 120 may be integrated with the SAR ADC 100. Also, in an embodiment of the present disclosure, the mode controller 120 may be a software module.

Figure 2:
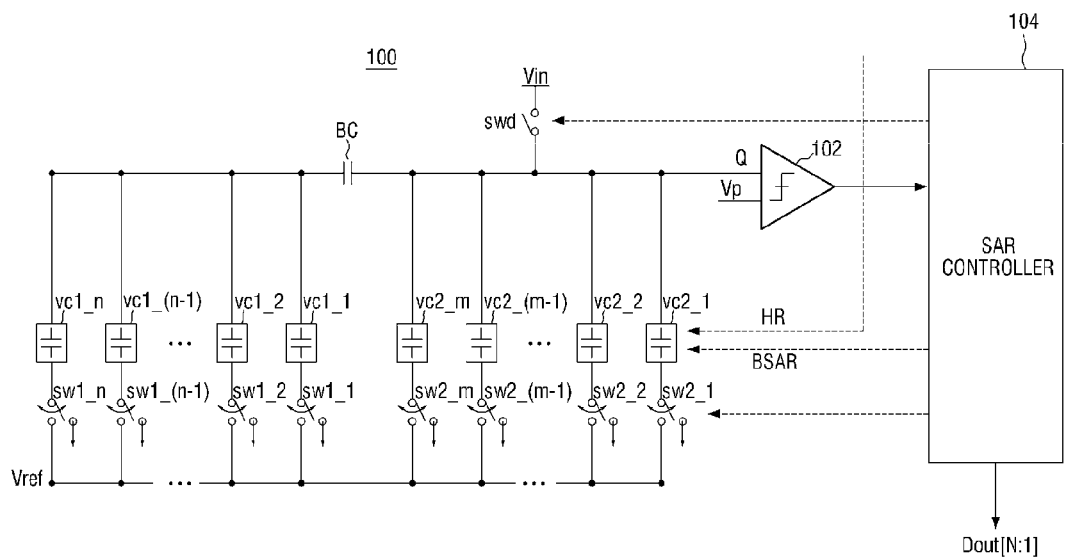
FIG. 2 is a block diagram of an SAR ADC of FIG. 1 according to an embodiment of the present disclosure.
Figure 3:
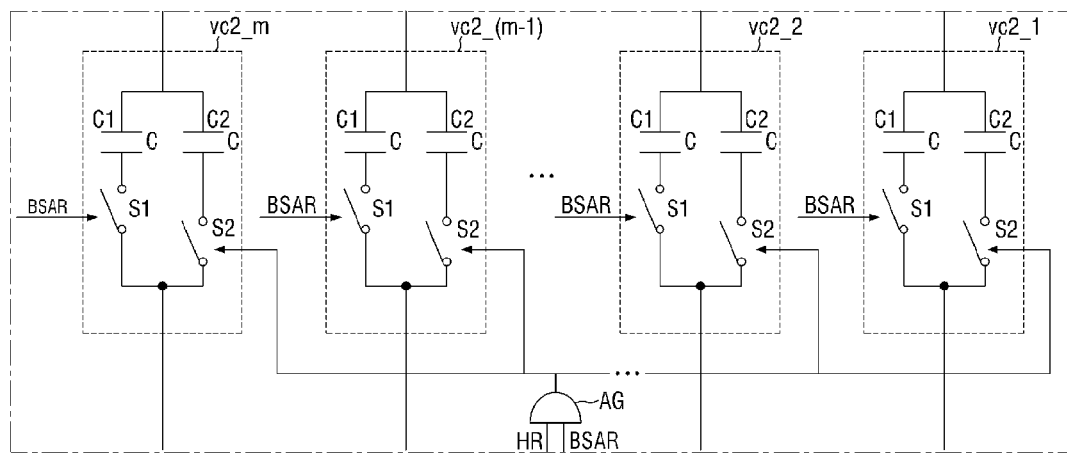
FIG. 3 is a block diagram of variable sampling capacitors of FIG. 2 according to an embodiment of the present disclosure.
Figure 4:
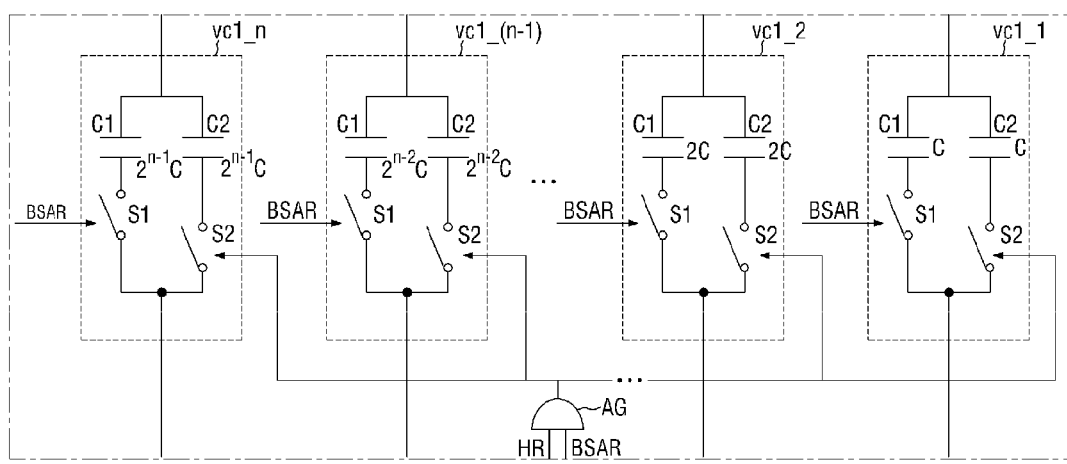
FIG. 4 is a block diagram of variable sampling capacitors of FIG. 2 according to an embodiment of the present disclosure.
Figure 5:
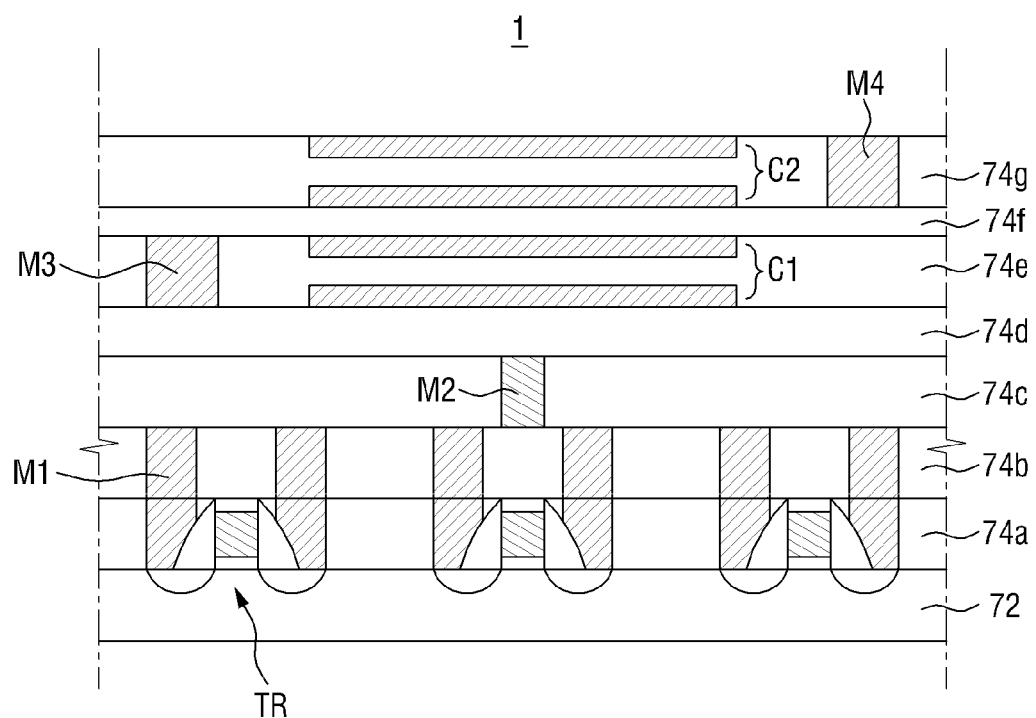
FIG. 5 is a cross-sectional view of a semiconductor device in which the variable sampling capacitor of FIG. 2 is formed according to an embodiment of the present disclosure.

FIG. 2 is a block diagram of the SAR ADC 100 of FIG. 1 according to an embodiment of the present disclosure. FIG. 3 is a block diagram of variable sampling capacitors of FIG. 2 according to an embodiment of the present disclosure. FIG. 4 is a block diagram of variable sampling capacitors of FIG. 2 according to an embodiment of the present disclosure. FIG. 5 is a cross-sectional view of a semiconductor device 1 in which the variable sampling capacitor of FIG. 2 is formed according to an embodiment of the present disclosure.

Referring to FIG. 2, the SAR ADC 100 may include a plurality of variable sampling capacitors (vc1_1 to vc1_$n$, vc2_1 to vc2_$m$), a bridge capacitor BC, a plurality of sampling switching elements (sw1_1 to sw1_$n$, sw2_1 to sw2_$m$), an input switching element swd, a comparator 102, and an SAR controller 104.

The input switching element swd may be disposed between an input port (IN in FIG. 1) to which the analog input signal Vin is input and a plurality of variable sampling capacitors (vc1_1 to vc1_$n$, vc2_1 to vc2_$m$). For example, the SAR controller 104 may control the input switching element swd so that an input port IN, to which the analog input signal Vin is input, and the plurality of variable sampling capacitors (vc1_1 to vc1_$n$, vc2_1 to vc2_$m$) are connected to each other.

The plurality of sampling switching elements (sw1_1 to sw1_$n$, sw2_1 to sw2_$m$) may be disposed between the plurality of variable sampling capacitors (vc1_1 to vc1_$n$, vc2_1 to vc2_$m$) and the reference capacitor (Cref in FIG. 1). Also, the plurality of sampling switching elements (sw1_1 to sw1_$n$, sw2_1 to sw2_$m$) may be disposed between the plurality of variable sampling capacitors (vc1_1 to vc1_$n$, vc2_1 to vc2_$m$) and a ground terminal.

For example, the SAR controller 104 may control the plurality of sampling switching elements (sw1_1 to sw1_$n$, sw2_1 to sw2_$m$) so that the plurality of variable sampling capacitors (vc1_1 to vc1_$n$, vc2_1 to vc2_$m$) is connected to one of the reference capacitor (Cref in FIG. 1) and the ground terminal.

When the plurality of sampling switching elements (sw1_1 to sw1_$n$, sw2_1 to sw2_$m$) is connected to the reference capacitor (Cref in FIG. 1), the reference voltage Vref may be provided to the plurality of variable sampling capacitors (vc1_1 to vc1_$n$, vc2_1 to vc2_$m$). Further, when the plurality of sampling switching elements (sw1_1 to sw1_$n$, sw2_1 to sw2_$m$) is connected to the ground terminal, the ground voltage may be provided to the plurality of variable sampling capacitors (vc1_1 to vc1_$n$, vc2_1 to vc2_$m$).

The plurality of variable sampling capacitors (vc1_1 to vc1_$n$, vc2_1 to vc2_$m$) may include a plurality of first variable sampling capacitors (vc1_1 to vc1_$n$), and a plurality of second variable sampling capacitors (vc2_1 to vc2_$m$). As illustrated in FIG. 2, the plurality of first variable sampling capacitors (vc1_1 to vc1_$n$) and the plurality of second variable sampling capacitors (vc2_1 to vc2_$m$) may have a split structure that is divided by a bridge capacitor BC.

The plurality of variable sampling capacitors (vc1_1 to vc1_$n$, vc2_1 to vc2_$m$) may be disposed in a number that is necessary to determine the N bits of the digital output signal Dout. That is, in order to determine the N bits of the digital output signal Dout, n (e.g. n is a natural number) first variable sampling capacitors (vc1_1 to vc1_$n$) and m (e.g. m is a natural number) second variable sampling capacitors (vc2_1 to vc2_$m$) may be disposed.

The capacitance values of the plurality of variable sampling capacitors (vc1_1 to vc1_$n$, vc2_1 to vc2_$m$), for example, may be variable depending on the control signal HR provided from the mode controller (120 in FIG. 1) and the switching signal BSAR provided from the SAR controller 104.

For example, when the control signal HR and the switching signal BSAR of a first level (e.g., a logic high level, hereinafter, referred to as H) are provided, the plurality of variable sampling capacitors (vc1_1 to vc1_$n$, vc2_1 to vc2_$m$) may have a first capacitance, and when the control signal HR of the second level (e.g., a logic low level, hereinafter, referred to as L) and the switching signal BSAR of the first level H are provided, the plurality of variable sampling capacitors may have a second capacitance that is less than the first capacitance. This is described below in more detailed.

In an embodiment of the present disclosure, the plurality of first variable sampling capacitors (vc1_1 to vc1_$n$) has a binary-weighted structure, and the plurality of second variable sampling capacitors (vc2_1 to vc2_$m$) may have a thermometer code structure.

For example, referring to FIG. 3, each of the plurality of second variable sampling capacitors (vc2_1 to vc2_$m$) may include a first sampling capacitor C1 and a second sampling capacitor C2 having a unit capacitance C. That is, the plurality of second variable sampling capacitors (vc2_1 to vc2_$m$) may have a thermometer code structure.

The first switching element S1 is controlled by the switching signal BSAR and may control whether the first sampling capacitor C1 is connected or not.

The second switching element S2 is controlled by the switching signal BSAR and the control signal HR and may control whether the second sampling capacitor C2 is used. Specifically, the second switching element S2 is controlled by the output of an AND gate AG that performs the AND operation of the switching signal BSAR and the control signal HR and may control whether the second sampling capacitor C2 is connected or not.

Therefore, when the switching signal BSAR, of the first level H, and the control signal HR, of the second level L, are applied to the plurality of second variable sampling capacitors (vc2_1 to vc2_$m$), the first switching element S1 may be turned on (e.g. switching element S1 is closed) and the second switching element S2 may be turned off (e.g. switching element S2 is opened). Thus, the capacitance of each of the second variable sampling capacitors (vc2_1 to vc2_$m$) may be the unit capacitance C.

In addition, when the switching signal BSAR and the control signal HR, both of the first level H, are applied to the plurality of second variable sampling capacitors (vc2_1 to vc2_$m$), all the first switching element S1 and the second switching Both element S2 may be turned on (e.g. closed). Thus, the capacitance of each of the second variable sampling capacitors (vc2_1 to vc2_$m$) may be 2C (e.g. twice the unit capacitance C). That is, the capacitance values of the plurality of second variable sampling capacitors (vc2_1 to vc2_$m$) may be variable depending on the control signal HR and the switching signal BSAR.

Then, referring to FIG. 4, each of the plurality of first variable sampling capacitors (vc1_1 to vc1_$n$) may include the first sampling capacitor C1 and the second sampling capacitor C2 having the capacitance $2^{n-1}$ times the unit capacitance C (e.g. $2^{n-1}$C). That is, the plurality of first variable sampling capacitors (vc1_1 to vc1_$n$) may have a binary-weighted structure.

The first switching element S1 is controlled by the switching signal BSAR, and may control whether the first sampling capacitor C1 is connected or not.

The second switching element S2 is controlled by the switching signal BSAR and the control signal HR, and may control whether the second sampling capacitor C2 is connected or not. For example, the second switching element S2 is controlled by the output of the AND gate AG that performs an AND operation of the switching signal BSAR and the control signal HR, and may control whether the second sampling capacitor C2 is connected or not.

Therefore, when the switching signal BSAR, of the first level H, and the control signal HR, of the second level L, are applied to the plurality of first variable sampling capacitors (vc1_1 to vc1_$n$), the first switching element S1 may be turned on (e.g. closed), and the second switching element S2 may be turned off (e.g. opened). Thus, the capacitance of the plurality of first variable sampling capacitors (vc1_1 to vc1_$n$) may have values that successively increase from the unit capacitance C to $2^{n-1}$ times the unit capacitance C (e.g. $2^nC$).

In addition, when the switching signal BSAR and the control signal HR, both of the first level H, are applied to the plurality of first variable sampling capacitors (vc1_1 to vc1_$n$), all the first switching element S1 and the second switching element S2 may be turned on (e.g. closed). Thus, the capacitance of the plurality of first variable sampling capacitors (vc1_1 to vc1_$n$) may have the values that successively increase from 2C (e.g. twice the unit capacitance C) to $2^n$ times the unit capacitance C (e.g. $2^nC$).

That is, the capacitance values of the plurality of first variable sampling capacitors (vc1_1 to vc1_$n$) may also be variable depending on the control signal HR and the switching signal BSAR.

Thus, the first sampling capacitor C1 and the second sampling capacitor C2 included in each of the variable sampling capacitors (vc1_1 to vc1_$n$, vc2_1 to vc2_$m$) may be disposed in different layers.

For example, referring to FIG. 5, the semiconductor device 1 may include a transistor TR for embodying the SAR ADC 100 in FIG. 1 described above, a plurality of wires M1 to M4 (e.g. metal layers), and a plurality of interlayer insulating films 74a to 74g.

The transistor TR may be formed on a substrate 72. The substrate 72 may contain a semiconductor material. The semiconductor materials, for example, may be made up of one or more materials selected from the group consisting of silicon (Si), germanium (Ge), silicon-germanium (SiGe), gallium-phosphorus (GaP), gallium-arsenic (GaAs), silicon-carbon (SiC), silicon-germanium-carbon (SiGeC), indium-arsenic (InAs) and indium-phosphorus (InP).

However, the present disclosure is not limited to these examples, and in an embodiment of the present disclosure, the substrate 72 may also be an insulating substrate. That is, the substrate 72, for example, may be a silicon on insulator (SOI) substrate. When the substrate 72 is an SOI substrate, the response speed of the semiconductor device may be improved.

A plurality of interlayer insulating films 74a to 74g may be sequentially stacked on the substrate 72. The interlayer insulating film 74a may include a transistor TR and a first wiring M1 (e.g. a first metal layer), and the interlayer insulating film 74b may include a first wiring M1. The interlayer insulating film 74c may include a second wiring M2 (e.g. a second metal layer).

The interlayer insulating film 74e may include a first sampling capacitor C1 and a third wiring M3 (e.g. a third metal layer). That is, the first sampling capacitor C1 may be disposed at the same height (e.g. in the same layer) as the third wiring M3. The interlayer insulating film 74g may include a second sampling capacitor C2 and a fourth wiring M4 (e.g. a fourth metal layer). In other words, the second sampling capacitor C2 may be disposed at the same height (e.g. in the same layer) as the fourth wiring M4.

Although the second sampling capacitor C2 is disposed over the first sampling capacitor C1 in the drawings, the present disclosure is not limited thereto. The positions of the first sampling capacitor C1 and the second sampling capacitor C2 may be changed.

As described above, in the semiconductor device 1 according to an embodiment of the present disclosure, the use (e.g. inclusion) of the first sampling capacitor C1 and the second sampling capacitor C2 is determined by the control signal HR and the switching signal BSAR, and the capacitance values of the plurality of variable sampling capacitors (vc1_1 to vc1_n, vc2_1 to vc2_m) change accordingly.

Thus, when using (e.g. including) the additional sampling capacitor, the element size may increase due to an area occupied by the additional sampling capacitor. Thus, in the semiconductor device 1 according to this embodiment, as illustrated in FIG. 5, by disposing the first sampling capacitor C1 and the second sampling capacitors to C2 in the different layers, it is possible to easily embody a plurality of variable sampling capacitors (vc1_1 to vc1_n, vc2_1 to vc2_m) without requiring additional horizontal area.

Referring to FIG. 2, the comparator 102 compares the voltage of a first input node Q connected to one input of the comparator 102 to a comparison voltage Vp of a second input node connected to the other input of the comparator 102, and may output the comparison result. The voltage of the first input node Q may be determined by the operation of the plurality of sampling switching elements (sw1_1 to sw1_n, sw2_1 to sw2_m) and may be used to determine each bit of the digital output signal Dout by being compared to the comparison voltage Vp.

In an embodiment of the present disclosure, a sample and hold circuit that samples and holds an analog input signal Vin may be connected to the other input of the comparator 102.

The SAR controller 104 provides the switching signal BSAR to the plurality of variable sampling capacitors (vc1_1 to vc1_n, vc2_1 to vc2_m), and may control the input switching element swd and the plurality of sampling switching elements (sw1_1 to sw1_n, sw2_1 to sw2_m).

For example, the SAR controller 104 may control the input switching element swd to sample the analog input signal Vin, at the time when there is a need for sampling of the analog input signal Vin provided externally.

Then, the SAR controller 104 may control the plurality of sampling switching elements (sw1_1 to sw1_n, sw2_1 to sw2_m) at the time of converting the analog input signal Vin into the digital output signal Dout.

In an embodiment of the present disclosure, the SAR controller 104 may include a register that sequentially stores the output of the comparator 102 that determines each bit of the digital output signal Dout. The SAR controller 104 may output the data stored in the register to the digital output signal Dout.

However, the present disclosure is not limited thereto, and, the register (for example, a SAR) may be separate from the SAR controller 104.

Figure 6:
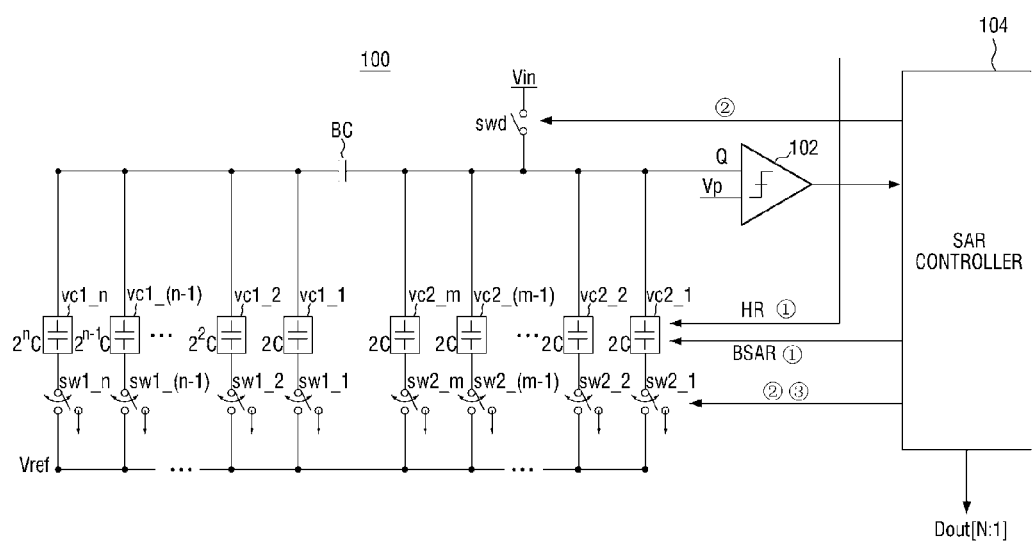
FIGS. 6 and 7 are block diagrams of a semiconductor device according to an embodiment of the present disclosure.
Figure 7:
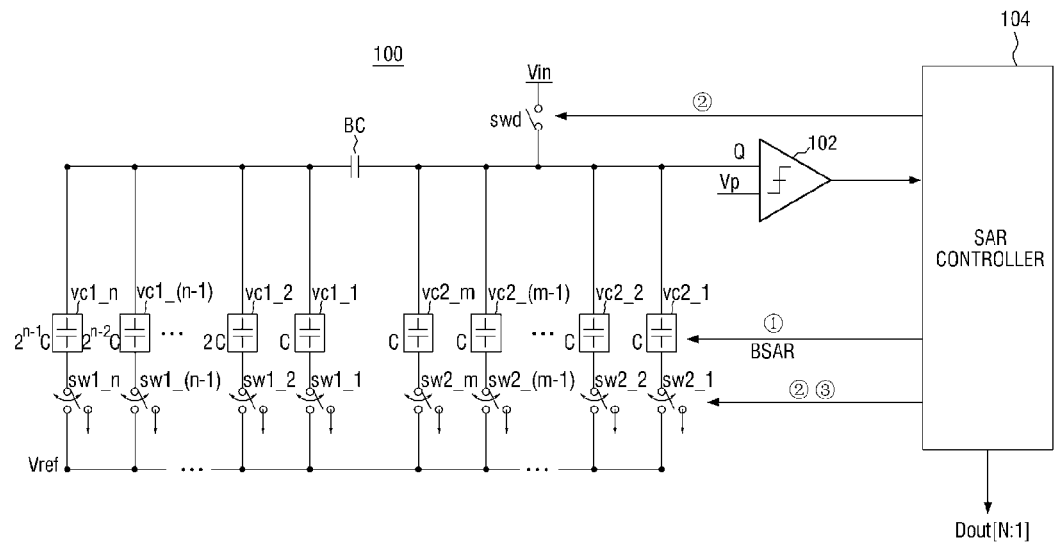

FIGS. 6 and 7 are block diagrams of the semiconductor device according to an embodiment of the present disclosure.

Referring to FIG. 6, for example, when the first analog input signal of a low frequency is provided as the analog input signal Vin, the mode controller 120 in FIG. 1 may output the control signal HR of the first level H, and the SAR controller 104 may output the switching signal BSAR of the first level H (①).

Thus, each of the first variable sampling capacitors (vc1_1 to vc1_n) may have the capacitance values from 2C to $2^n$C, and each of the second variable sampling capacitors (vc2_1 to vc2_m) may have the capacitance value of 2C.

Then, the SAR controller 104 turns on the input switching element swd in the state of connecting the plurality of sampling switching elements (sw1_1 to sw1_n, sw2_1 to sw2_m) to the ground terminal (②).

Thus, the analog input signal Vin is distributed to a plurality of variable sampling capacitors (vc1_1 to vc1_n, vc2_1 to vc2_m) and the voltage of the first input node Q may be determined.

Then, the SAR controller 104 sequentially connects the plurality of sampling switching elements (sw1_1 to sw1_n, sw2_1 to sw2_m) to the reference voltage Vref and compares the voltage of the first input node Q with the comparison voltage Vp to determine the respective bits of the digital output signal Dout (③).

Since a person of ordinary skill in the art would understand the concept of the analog-to-digital conversion method using the successive approximation method, a more detailed description is omitted.

Then, referring to FIG. 7, for example, when the second analog input signal of a high frequency is provided as the analog input signal Vin, the mode controller 120 in FIG. 1 outputs the control signal HR of the second level L, and the SAR controller 104 may output the switching signal BSAR of the first level H (①).

Thus, each of the first variable sampling capacitors (vc1_1 to vc1_n) may have the capacitance values from C to $2^{n-1}$C, and each of the second variable sampling capacitors (vc2_1 to vc2_m) may have the capacitance value of C.

Then, the SAR controller 104 turns on (e.g. closes) the input switching element swd in the state of connecting the plurality of sampling switching elements (sw1_1 to sw1_n, sw2_1 to sw2_m) to the ground terminal (②).

Accordingly, the analog input signal Vin is distributed to the plurality of variable sampling capacitors (vc1_1 to vc1_n, vc2_1 to vc2_m) and the voltage of the first input node Q may be determined.

Then, the SAR controller 104 sequentially connects the plurality of sampling switching elements (sw1_1 to sw1_n, sw2_1 to sw2_m) to the reference voltage Vref and compares the voltage of the first input node Q with the comparison voltage Vp to determine each bit of the digital output signal Dout (③).

An input impedance Rin viewed from the input port IN of the SAR ADC 100 illustrated in FIG. 1 may be calculated in Equation (1) as follows.

$$R_{in}=1/(F_S C_{samp}) \quad (1)$$

In this case, $F_s$ is the frequency of the analog input signal Vin, and $C_{samp}$ is the capacitance of the plurality of the variable sampling capacitors (vc1_1 to vc1_n, vc2_1 to vc2_m).

In this case, when the frequency of the analog input signal Vin is high and the capacitance of the plurality of variable sampling capacitors (vc1_1 to vc1_n, vc2_1 to vc2_m) is large, the input impedance Rin may become so small that it may be difficult to drive the SAR ADC 100.

Thus, in the semiconductor device 1 according to an embodiment of the present disclosure, when the frequency of the analog input signal Vin is high, the capacitance of the plurality of variable sampling capacitors (vc1_1 to vc1_n, vc2_1 to vc2_m) is reduced, and when the frequency of the analog input signal Vin is low, the capacitance of the plurality of variable sampling capacitors (vc1_1 to vc1_n, vc2_1 to vc2_$m$) is increased. Thus, it is possible to maintain the input impedance of the SAR ADC at a constant level regardless of the frequency of the input signal.

Figure 8:
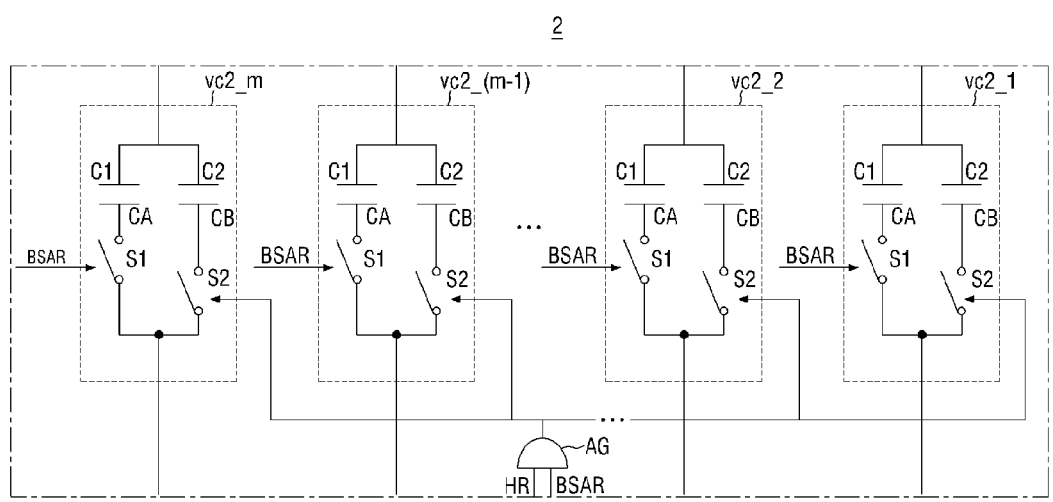
FIGS. 8 and 9 are block diagrams of a semiconductor device according to an embodiment of the present disclosure.
Figure 9:
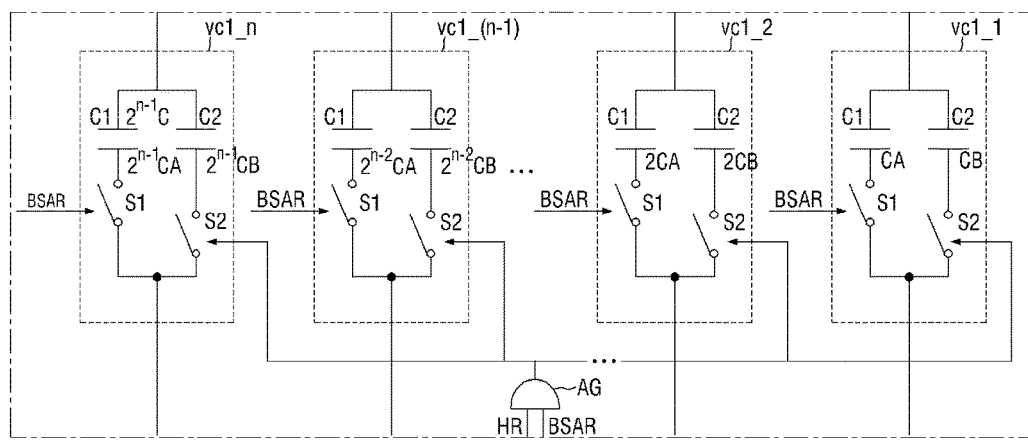

FIGS. 8 and 9 are block diagrams of a semiconductor device 2 according to an embodiment of the present disclosure according to an embodiment of the present disclosure. Hereinafter, differences from the previous embodiments of the present disclosure are mainly described.

Referring to FIG. 8, each of the plurality of second variable sampling capacitors (vc2_1 to vc2_$m$) of the semiconductor device 2 according to an embodiment of the present disclosure may include a first sampling capacitor C1 having a third capacitance CA, and a second sampling capacitor C2 having a fourth capacitance CB. A plurality of second variable sampling capacitors (vc2_1 to vc2_$m$) may have a thermometer code structure.

In an embodiment of the present disclosure, the third capacitance CA and the fourth capacitance CB may be different from each other. For example, the fourth capacitance CB may be greater than the third capacitance CA.

Then, referring to FIG. 9, each of the plurality of first variable sampling capacitors (vc1_1 to vc1_$n$) of the semiconductor device 2 according to an embodiment of the present disclosure may include a first sampling capacitor C1 having a capacitance $2^{n-1}$ times the third unit capacitance CA (e.g. $2^{n-1}$CA), and a second sampling capacitor C2 having a capacitance $2^{n-1}$ times the fourth unit capacitance CB (e.g. $2^{n-1}$CB). That is, the plurality of first variable sampling capacitors (vc1_1 to vc1_$n$) may have a binary-weighted structure.

In an embodiment of the present disclosure, the third capacitance CA and the fourth capacitance CB may be different from each other. For example, the fourth capacitance CB may be greater than the third capacitance CA.

Figure 10:
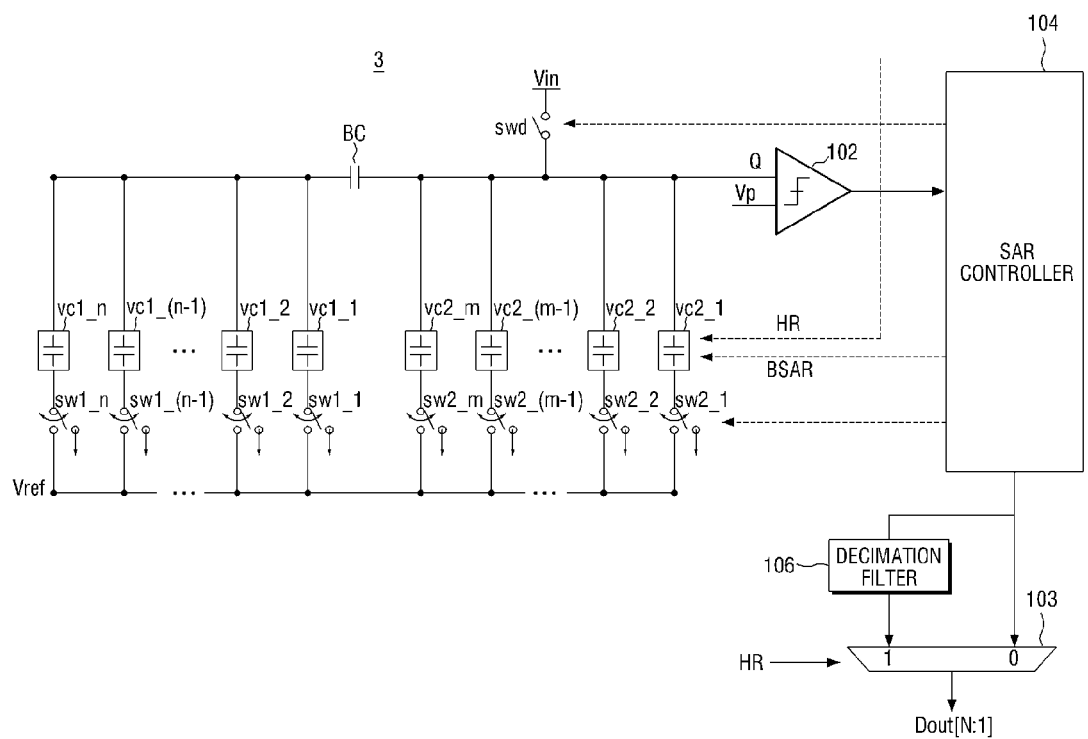
FIG. 10 is a block diagram of a semiconductor device according to an embodiment of the present disclosure.

FIG. 10 is a block diagram of a semiconductor device 3 according to an embodiment of the present disclosure. Hereinafter, differences from the above-described embodiments of the present disclosure are mainly described.

Referring to FIG. 10, the semiconductor device 3 according to an embodiment of the present disclosure may include a decimation filter 106 and an output unit 103 controlled by the control signal HR.

The decimation filter 106 may filter the output signal of the SAR controller 104.

The output unit 103, for example, may output either the output of the decimation filter 106 or the output of the SAR controller 104 as the digital output signal Dout, depending on the control signal HR.

For example, when the control signal HR of the first level H is applied, the output unit 103 may output the signal filtered by the decimation filter 106 as the digital output signal Dout, and when the control signal HR of the first level H is applied, the output unit 103 may output the output of the SAR controller 104, which is not filtered by the decimation filter 106, as the digital output signal Dout.

It is described above that when the analog input signal Vin with a relatively low frequency is provided, the control signal HR of the first level H is applied. Thus, the signal filtered by the decimation filter 106 may be output as the digital output signal Dout. Also, it is described above that when the analog input signal Vin with a relatively high frequency is provided, the control signal HR of the second level L is applied. Thus, the output of the SAR controller 104, which is not filtered by the decimation filter 106, may be output as the digital output signal Dout.

For example, in the case of an analog input signal based on a second generation (2G) or a third generation (3G) wireless communication method that is an analog input signal with a relatively low frequency, it is possible to reduce noise using the decimation filter 106. That is, it is possible to improve the signal to noise ratio (SNR) characteristics of the signal using the decimation filter 106.

When the SNR characteristics of the signal are improved, the quality of the signal is determined by the signal distortion (e.g. distortion) components. However, the signal distortion components may be affected by a variation of the sampling capacitor included in the SAR ADC. That is, when the variation of the sampling capacitor increases according to a process variation, the signal distortion components increase, and the signal quality may be degraded.

Therefore, in order to reduce the variation of the sampling capacitor, it is useful to increase the capacitance of the sampling capacitor. For example, when comparing a sampling capacitor of 1 pF as a unit capacitance to a sampling capacitor of 10 pF as a unit capacitance, the sampling capacitor of 10 pF as a unit capacitance is less affected by process variation. For example, the reason is that, when it is assumed that the capacitance of the sampling capacitor differs by about 0.1 pF, the sampling capacitor of 1 pF as a unit capacitance has a variation of 10%, but the sampling capacitor of 10 pF as a unit capacitance has a variation of 1%.

Therefore, in order to improve the signal quality by reducing the signal distortion components, the capacitance of the sampling capacitor used in the SAR ADC must increase. Thus, when the noise components are removed by the decimation filter 106 and the capacitance of the sampling capacitor used in the SAR ADC is increased to reduce the signal distortion components, the signal to noise distortion ratio (SNDR) characteristics of the signal may be improved.

However, as described above, when the frequency of the analog input signal Vin is high and the capacitance of the sampling capacitor used in the ADC SAR is large, the input impedance may become so small that it may be difficult to drive the SAR ADC.

Therefore, in the semiconductor device 3 according to an embodiment of the present disclosure, when the analog input signal Vin with a relatively low frequency is applied as the analog input signal Vin, by increasing the capacitance of the sampling capacitor used in the SAR ADC to reduce the signal distortion component and by removing the noise components by the decimation filter 106, the SNDR characteristics of the signal are improved. When the analog input signal Vin with a relatively high frequency is applied as the analog input signal Vin, the SAR ADC is stably driven by reducing the capacitance of the sampling capacitor used in the SAR ADC.

Figure 11:
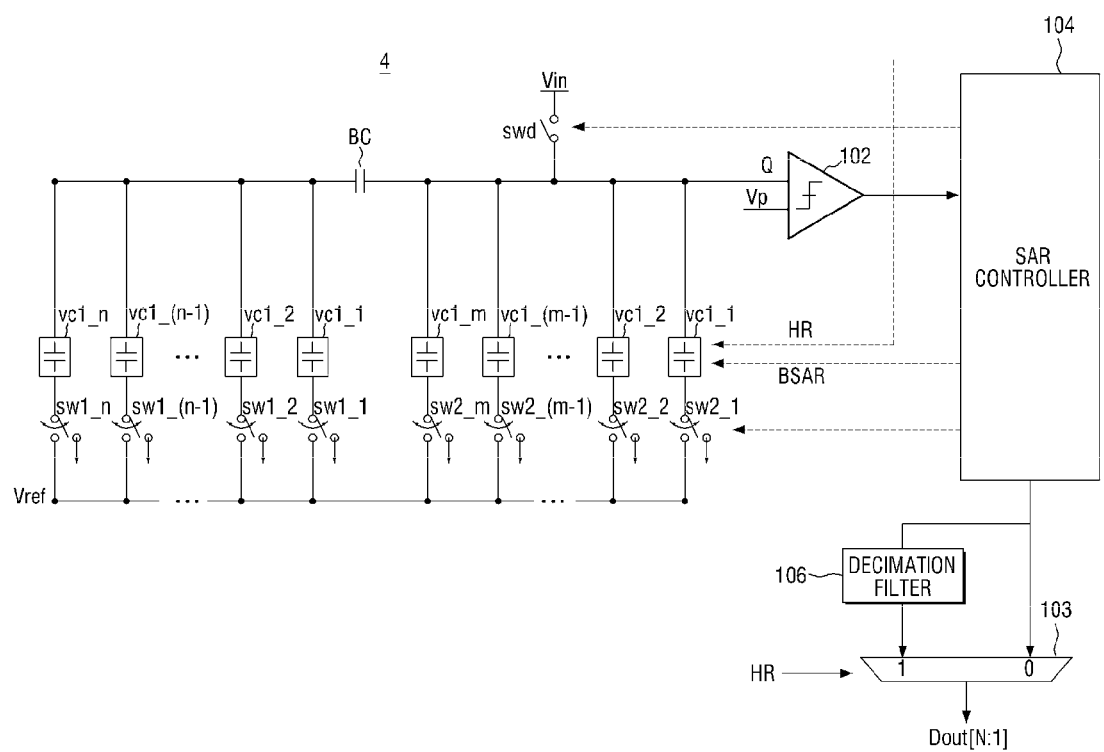
FIG. 11 is a block diagram of a semiconductor device according to an embodiment of the present disclosure.

FIG. 11 is a block diagram of a semiconductor device 4 according to an embodiment of the present disclosure. Hereinafter, differences from the above-described embodiments of the present disclosure are mainly described.

Referring to FIG. 11, the semiconductor device 4 according to an embodiment of the present disclosure is similar to the above-described semiconductor device 1 in the split structure using the bridge capacitor BC.

However, the semiconductor device 4 according to an embodiment of the present disclosure is different from the above-described semiconductor device 1 in that the above-described semiconductor device 1 includes a plurality of variable sampling capacitors (vc1_1 to vc1_$n$) of a binary-weighted structure and a plurality of second variable sampling capacitor structures (vc2_1 to vc2_$m$) of a thermometer code structure, whereas the semiconductor device 4 includes a plurality of first variable sampling capacitors (vc1_1 to vc1_n) of a binary-weighted structure, and the a plurality of second variable sampling capacitor structures (vc1_1 to vc1_m) of a binary-weighted structure.

Figure 12:
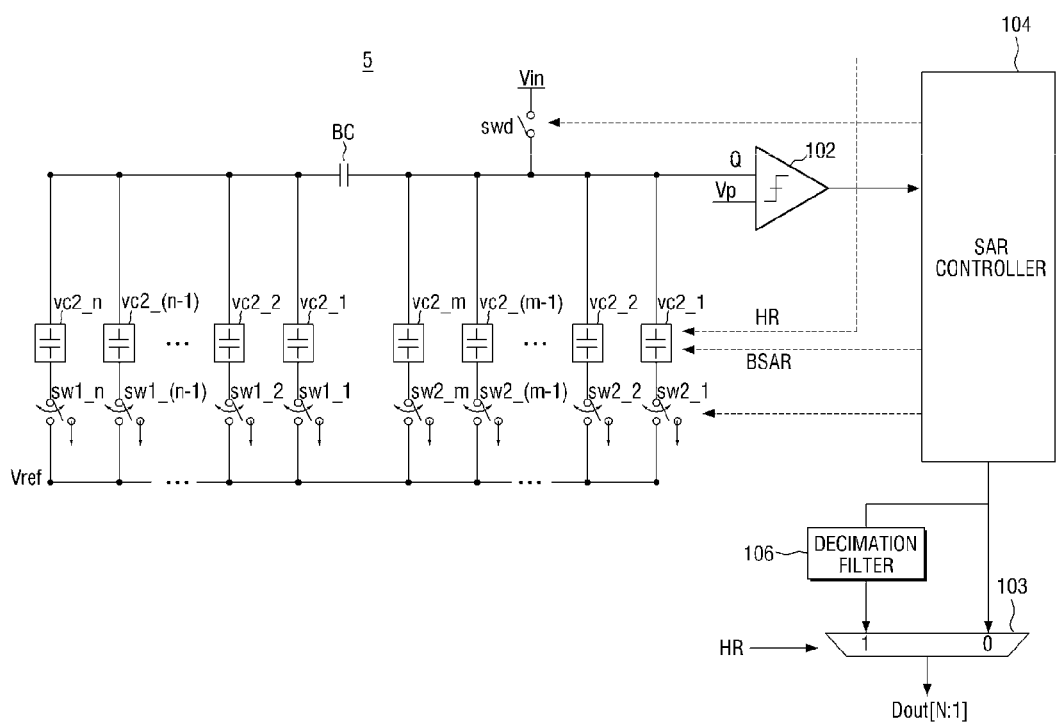
FIG. 12 is a block diagram of a semiconductor device according to an embodiment of the present disclosure.

FIG. 12 is a block diagram of a semiconductor device 5 according to an embodiment of the present disclosure. Hereinafter, the differences from the above-described embodiments of the present disclosure are mainly described.

Referring to FIG. 12, semiconductor device 5 according to an embodiment of the present disclosure is similar to the above-described semiconductor device 1 in the split structure using the bridge capacitor BC.

However, the semiconductor device 5 according to an embodiment of the present disclosure is different from the above-described semiconductor device 1 in that the semiconductor device 1 includes a plurality of first variable sampling capacitors (vc1_1 to vc1_n) having a binary-weighted structure and a plurality of second variable sampling capacitor structures (vc2_1 to vc2_m) having a thermometer code structure, whereas the semiconductor device 4 includes a plurality of first variable sampling capacitors (vc2_1 to vc2_n) having the thermometer code structure, and a plurality of second variable sampling capacitor structures (vc2_1 to vc2_m) having a thermometer code structure.

Figure 13:
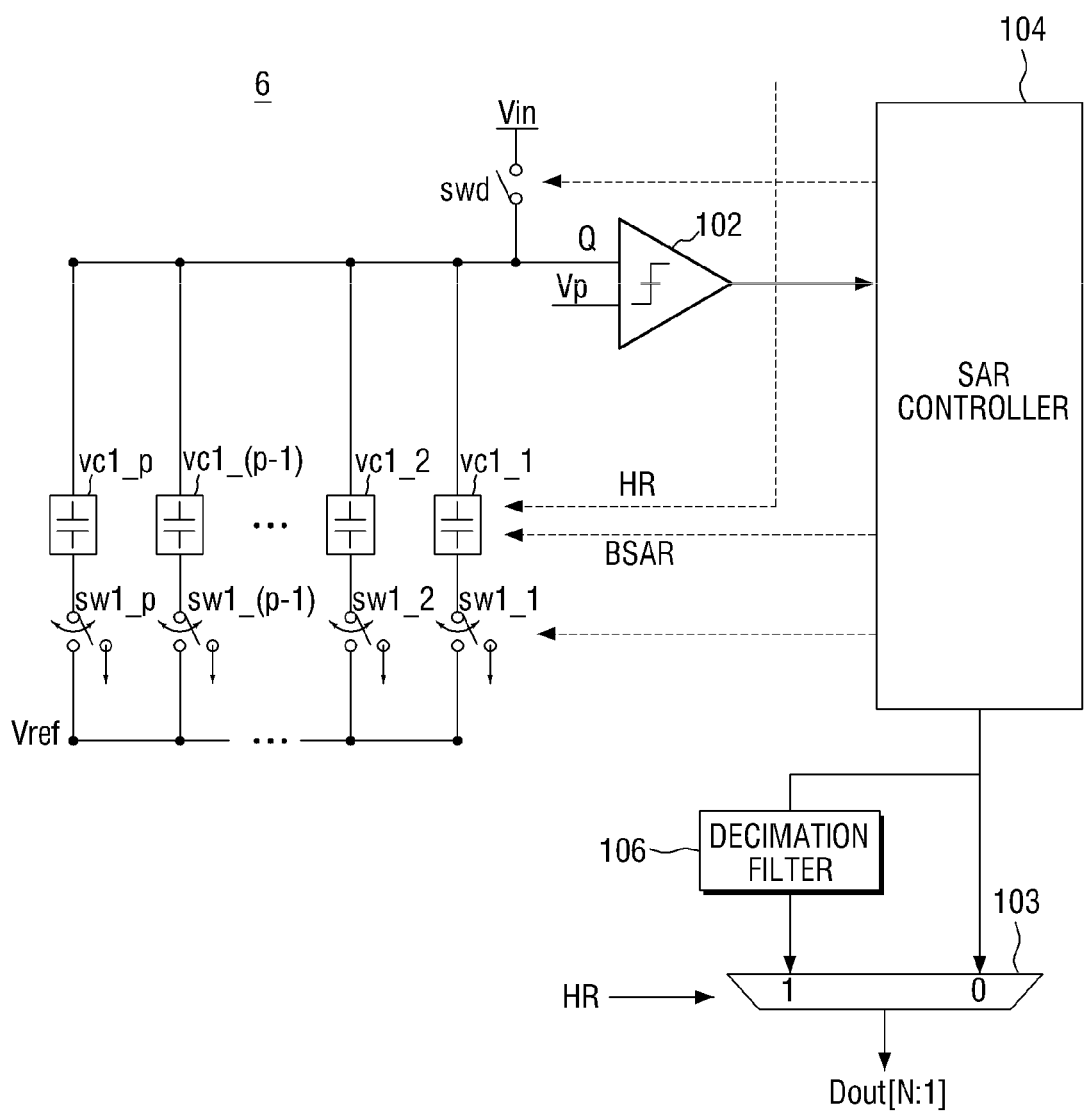
FIG. 13 is a block diagram of a semiconductor device according to an embodiment of the present disclosure.

FIG. 13 is a block diagram of a semiconductor device 6 according to an embodiment of the present disclosure. Hereinafter, the differences from the above-described embodiments of the present disclosure are mainly described.

The semiconductor device 6 according to an embodiment of the present disclosure is different from the above-described semiconductor device 1 in that a plurality of variable sampling capacitors (vc1_1 to vc1_p) of the semiconductor device 6 has a binary-weighted structure rather than a split structure.

Figure 14:
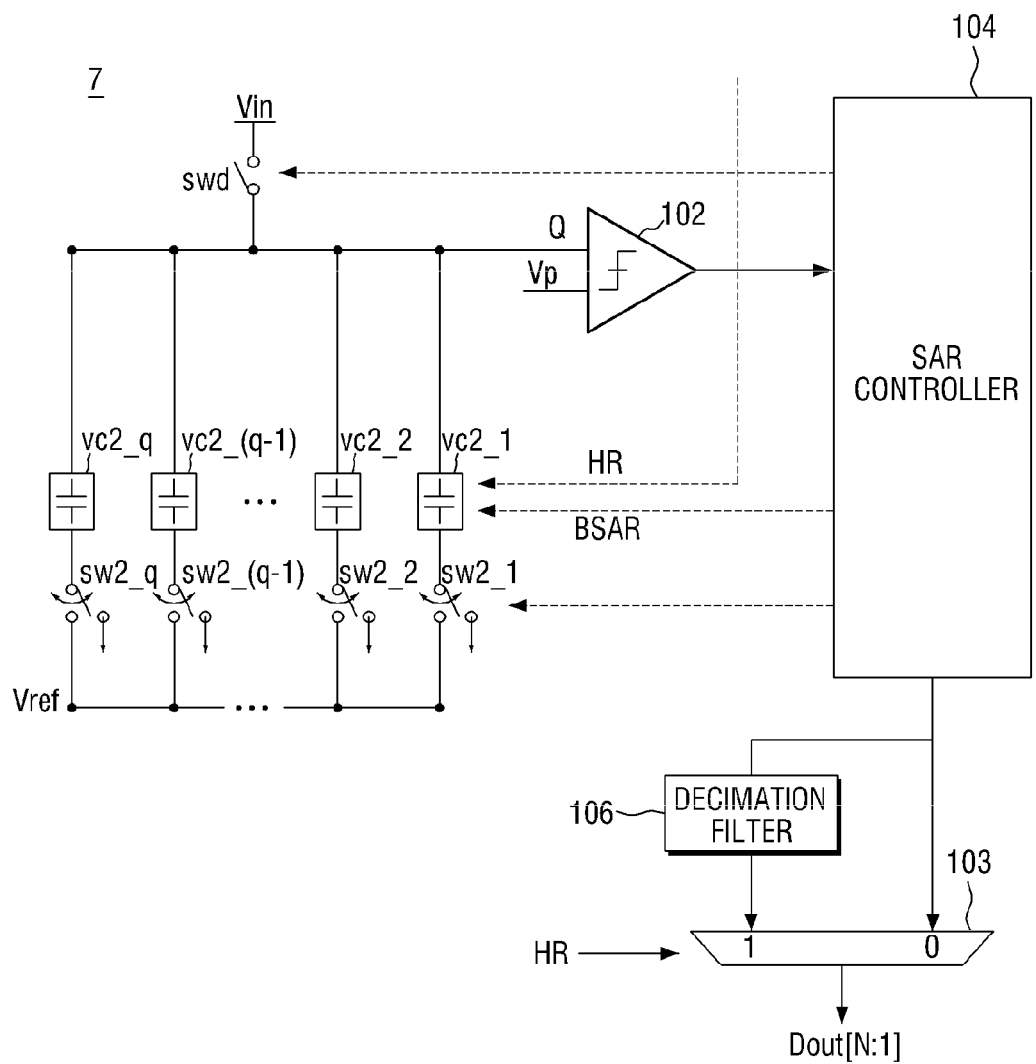
FIG. 14 is a block diagram of a semiconductor device according to an embodiment of the present disclosure.

FIG. 14 is a block diagram of a semiconductor device 7 according to an embodiment of the present disclosure. Hereinafter, the differences from the above-described embodiments of the present disclosure are mainly described.

The semiconductor device 7 according to an embodiment of the present disclosure is different from the above-mentioned semiconductor device 1 in that a plurality of variable sampling capacitors (vc2_1 to vc2_q) of the semiconductor device 7 has a thermometer code structure rather than a split structure.

Figure 15:
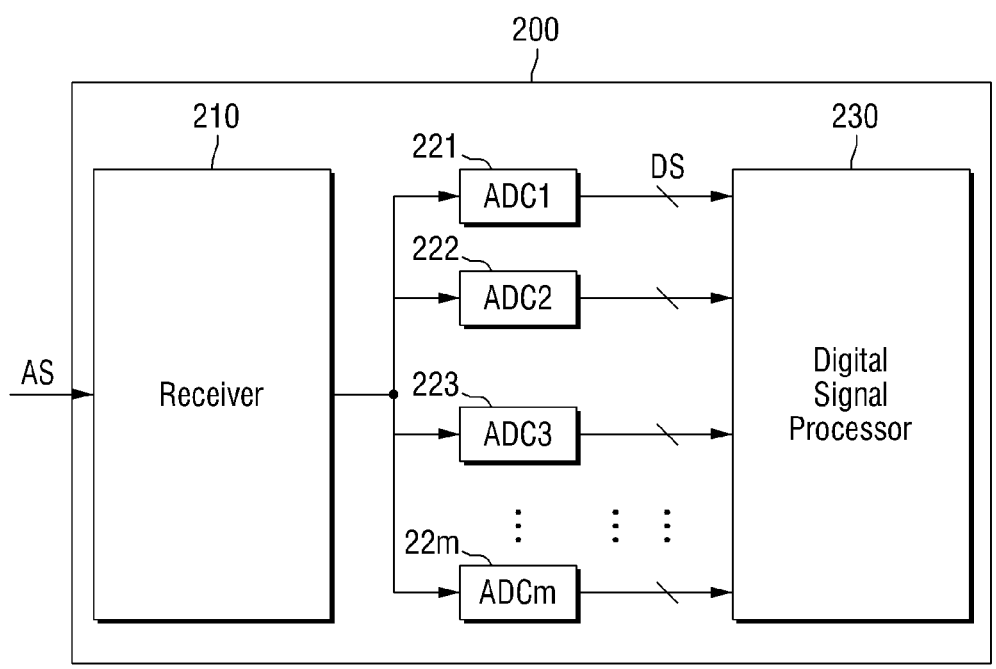
FIG. 15 is a block diagram of a system on chip (SoC) according to an embodiment of the present disclosure.

FIG. 15 is a block diagram of an SoC 8 according to an embodiment of the present disclosure. Hereinafter, the differences from the above-described embodiments of the present disclosure are mainly described.

Referring to FIG. 15, the SoC 8, for example, may include a modem semiconductor device 200.

The modem semiconductor device 200 may include a receiver terminal 210, a plurality of SAR ADCs 221 to 22m and a digital signal processor 230.

The receiver terminal 210 may receive an analog signal AS. In an embodiment of the present disclosure, the receiver terminal 210 may receive a plurality of analog signals AS.

The plurality of SAR ADCs 221 to 22m may convert the analog signal AS provided from the receiver terminal 210 into a digital signal DS using the successive approximation method. The plurality of SAR ADCs 221 to 22m, for example, may share a reference capacitor (e.g., Cref in FIG. 1).

In an embodiment of the present disclosure, a first analog signal (e.g., a 2G signal) may be provided to some of the plurality of SAR ADCs 221 to 22m, and a second analog signal (e.g., a 4G signal) may be provided to some of the other of the plurality of SAR ADCs 221 to 22m.

In this case, some parts of the plurality of SAR ADCs 221 to 22m may convert the first analog signal (e.g., a 2G signal) into a first digital signal, using a plurality of first sampling capacitors having 2nC (e.g., n is a natural number, and C is a rational number indicating unit capacitance) as a capacitance value, Some other parts of the plurality of SAR ADC 221 to 22m may convert the second analog signal (e.g., a 4G signal) into a second digital signal, using a plurality of second sampling capacitors having nC as the capacitance value.

The digital signal processor 230 receives the provision of the digital signals DS output from the plurality of SAR ADCs 221 to 22m, and may perform a digital operation.

Figure 16:
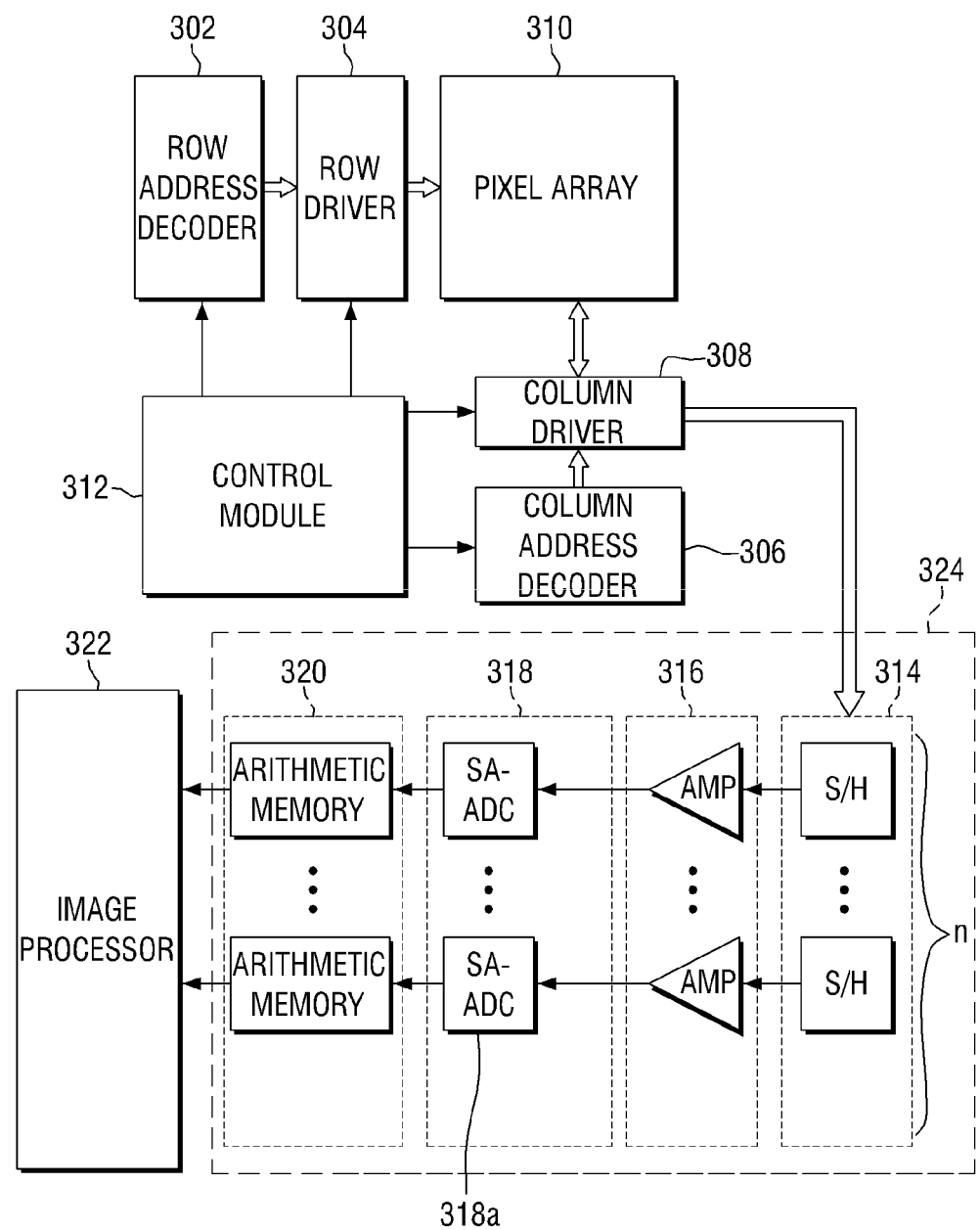
FIG. 16 is a block diagram of an SoC according to an embodiment of the present disclosure.

FIG. 16 is a block diagram of an SoC 9 according to an embodiment of the present disclosure.

Referring to FIG. 16, the SoC 9 may include a pixel array 310, a row driver 304, a column driver 308, a control module 312, a digital correlated double sampling module 324, and an image processor 322.

The pixel array 310 may have a plurality of pixels arranged in a predetermined number of rows/columns.

For example, the pixels located in a row of the pixel array 310 are simultaneously turned on by a row selection line, and pixel signals of each column may be selectively provided to an output line by a column selection line. A plurality of row/column selection lines may be provided for the entire pixel array 310.

The row driver 304 may selectively activate row lines in response to a row address decoder 302. In addition, the column driver 308 may selectively activate column selection lines in response to a column address decoder 306. Thus, the row/column address may be provided to each pixel of the pixel array 310.

The control module 312 may control the row address decoder 302 and the column address decoder 306 that select the row/column selection lines to read pixels.

For example, the control module 312 may control the row driver 304 and the column driver that apply a driving voltage to each drive transistor of the selected row/column selection lines 308.

The digital correlated double sampling module 324 may perform a digital correlated double sampling process, using pixel reset signals and pixel image signals of selected pixels of each column of the pixel array 310.

The digital correlated double sampling module 324 may include a sample and hold (S/H) module 314, an amplifier (AMP) module 316, a successive approximation analog-to-digital converter (SA-ADC) module 318 and an arithmetic memory module 320.

The S/H module 314 is associated with the column driver 308 and may include n S/H semiconductor devices. Each S/H semiconductor device may sample and hold a pixel reset signal and a pixel image signal for selected pixels of the pixel array 310. In this case, n may include an integer and may express the number or some of the columns.

The amplifier module 316 includes n amplifiers, and may amplify a sample (e.g., an output of an S/H), held pixel reset signals, and pixel image signals.

The SA-ADC module 318 includes n successive approximation analog-to-digital converter 318a, and each of the successive approximation analog-to-digital converters 318a may convert amplified pixel reset signals and pixel image signals into digital signals using the successive approximation method.

The n successive approximation analog-to-digital converters 318a may include the above-described variable sampling capacitors (e.g., at least one of vc1_1 to vc1_$n$ or vc2_1 to vc2_$m$ in FIG. 2).

The arithmetic memory module 320 includes n arithmetic memory semiconductor devices, and each of the n arithmetic memory semiconductor devices may generate a digital difference signal, by effectively obtaining a difference between a digital pixel reset signal and a digital pixel image signal using a most-significant-bit (MSB) first calculation. In this case, the MSB first calculation may include an addition or a subtraction operation including a binary operation.

The image processor 322 processes a digital difference signal provided from the arithmetic memory module 320 to provide an output image color reproduction of the image captured by a plurality of pixels of the pixel array 310.

For example, the image processor 322 performs various operations, and the various operations, for example, may include a positional gain adjustment, a defect correction, a noise reduction, an optical crosstalk reduction, demosaicing, resizing, sharpening or the like, but an embodiment of the present disclosure is not limited thereto.

Figure 17:
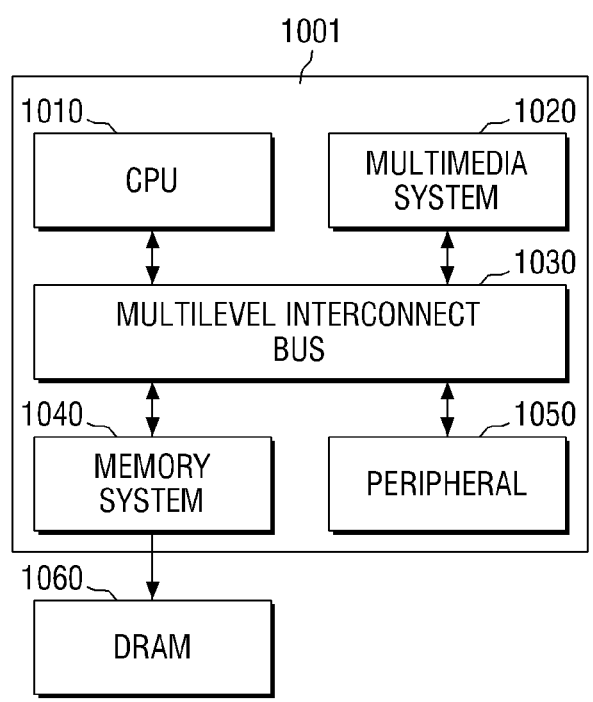
FIG. 17 is a block diagram of an SoC according to an embodiment of the present disclosure.

FIG. 17 is a block diagram of an SoC 17 according to an embodiment of the present disclosure.

Referring to FIG. 17, the SoC 17 may include an application processor 1001 and a dynamic random access memory (DRAM) 1060.

The application processor 1001 may include a central processing unit 1010, a multimedia system 1020, a multi-level interconnect bus 1030, a memory system 1040 and a peripheral circuit 1050.

The central processing unit 1010 may perform operations that are necessary to drive the SoC 17. In an embodiment of the present disclosure, the central processing unit 1010 may be configured by a multi-core environment that contains a plurality of cores.

The multimedia system 1020 may be used to perform various multimedia functions in the SoC system 17. The multi-media system 1020 may include a 3D engine module, a video coder/decoder (codec), a display system, a camera system, a post-processor or the like.

The multi-level interconnect bus 1030 may be used for data communication among the central processing unit 1010, the multimedia system 1020, the memory system 1040 and the peripheral circuit 1050. In an embodiment of the present disclosure, the multi-level interconnect bus 1030 may have a multilayer structure. For example, the multi-level interconnect bus 1030 may be, but is not limited to, a multilayer advanced high-performance bus (AHB) or a multilayer advanced extensible interface (AXI).

The memory system 1040 may provide an environment for the application processor 1001 to be connected to an external memory (e.g., the DRAM 1060) and operate at high speed. In an embodiment of the present disclosure, the memory system 1040 may include a controller (e.g., a DRAM controller) to control the external memory (e.g., the DRAM 1060).

The peripheral circuit 1050 may provide an environment for the SoC system 17 to connect to an external device (e.g., a mainboard). Accordingly, the peripheral circuit 1050 may include various interfaces that enable the external device connected to the SoC system 17 to be compatible with the SoC system 17.

The DRAM 1060 may function as an operating memory for the operation of the application processor 1001. In an embodiment of the present disclosure, the DRAM 1060 may be external to the application processor 1001 as illustrated.

For example, the DRAM 1060 may be packaged with the application processor 1001 in the form of a package on package (PoP).

The semiconductor device or SoC according to an above-described embodiment of the present disclosure may be provided as any one of the elements of the SoC system 17.

Figure 18:
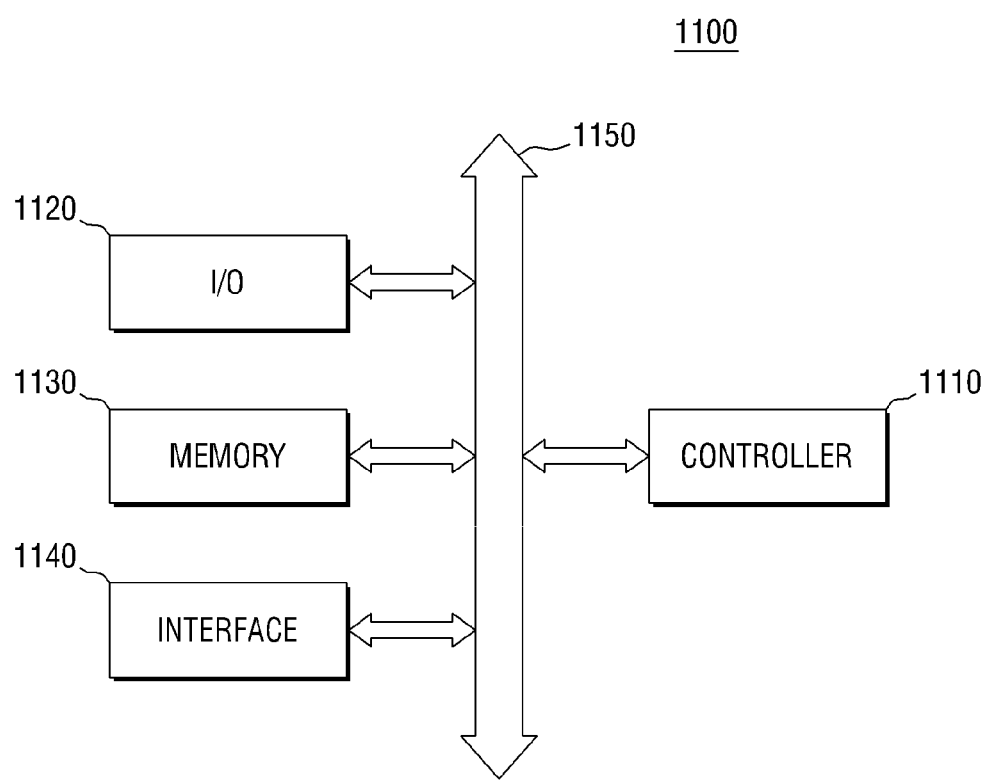
FIG. 18 is a block diagram of an electronic system including a semiconductor device and an SoC according to an embodiments of the present disclosure.

FIG. 18 is a block diagram of an electronic system 1100 including a semiconductor device and an SoC according to an embodiment of the present disclosure.

Referring to FIG. 18, the electronic system 1100 may include a controller 1110, an input/output (I/O) semiconductor device 1120, a memory semiconductor device 1130, an interface 1140 and a bus 1150. The controller 1110, the I/O semiconductor device 1120, the memory semiconductor device 1130 and/or the interface 1140 may be connected to one another by the bus 1150. The bus 1150 corresponds to a path through which data are moved.

The controller 1110 may include at least one of a microprocessor, a digital signal processor, a microcontroller and logic semiconductor devices capable of performing similar functions to the elements. The I/O semiconductor device 1120 may include a keypad, a keyboard and a display device. The memory semiconductor device 1130 may store data and/or commands. The interface 1140 may serve to transmit data to or receive data from a communication network. The interface 1140 may be a wired or wireless interface. For example, the interface 1140 may include an antenna or a wired or wireless transceiver.

The electronic system 1100 may be an operating memory for improving the operation of the controller 1110, and may also include a high-speed DRAM or static random access memory (SRAM).

The electronic system 1100 may be applied to all types of electronic products capable of transmitting or receiving information in a wireless environment, such as a personal digital assistant (PDA), a portable computer, a web tablet, a wireless phone, a mobile phone, a digital music player and a memory card.

Any one of the semiconductor devices or the SoC according to an embodiment of the present disclosure may be provided as at least one of the elements of the electronic system 1100.

Figure 19:
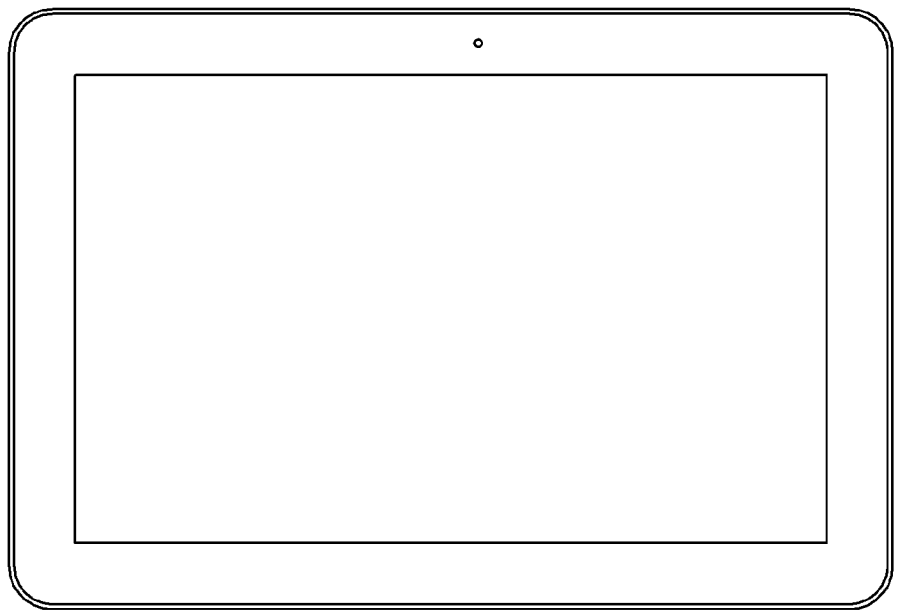
FIGS. 19 to 21 are systems to which a semiconductor device and an SoC according to an embodiment of the present disclosure are applicable.
Figure 20:
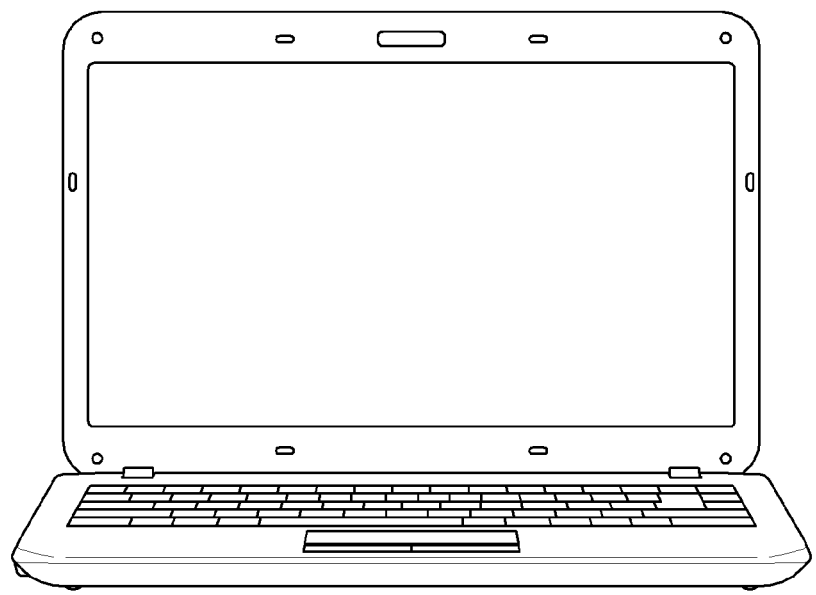
Figure 21:
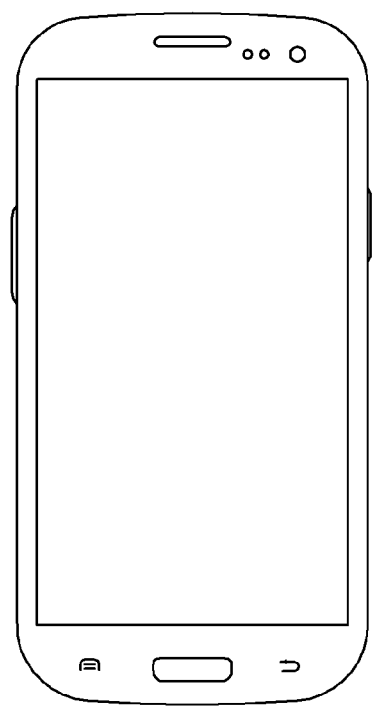

FIGS. 19 through 21 are systems to which a semiconductor device and an SoC according to an embodiment of the present disclosure are applied.

FIG. 19 illustrates a tablet personal computer (PC) 1200, FIG. 20 illustrates a notebook computer 1300, and FIG. 21 illustrates a smartphone 1400. At least one of the semiconductor devices or the SoC according to an above-described embodiment of the present disclosure may be used in the tablet PC 1200, the notebook computer 1300, and the smartphone 1400.

Further, it is obvious to a person skilled in the art that a semiconductor device according to an embodiment of the present disclosure may also be applied to other IC semiconductor devices other than those set forth herein. That is, while the tablet PC 120, the notebook computer 1300, and the smartphone 1400 have been described above as examples of a system according to an embodiment of the present disclosure, the examples of the system are not limited thereto. In an embodiment of the present disclosure, the system may be provided as a computer, an ultra mobile PC (UMPC), a work station, a net-book computer, a PDA, a portable computer, a wireless phone, a mobile phone, an e-book, a portable multimedia player (PMP), a portable game console, a navigation semiconductor device, a black box, a digital camera, a 3-dimensional television set, a digital audio recorder, a digital audio player, a digital picture recorder, a digital picture player, a digital video recorder, a digital video player, etc.

In addition, those skilled in the art will appreciate that many variations and modifications can be made to the embodiments of the present disclosure without departing from the scope and spirit of the present disclosure. Therefore, the embodiments of the present disclosure are used in a generic and descriptive sense only and not for purposes of limitation. Accordingly, the scope of the present disclosure is defined by the appended claims and their equivalents.

What is claimed is:

1. A semiconductor device, comprising:
a mode controller configured to output a control signal that has a first level in a first mode or a second level in a second mode, the first mode being different from the second mode, the first level being different from the second level; and
a successive approximation register analog-to-digital converter (SAR ADC) configured to convert an analog input signal into a digital output signal using a plurality of variable sampling capacitors,
wherein each of the plurality of variable sampling capacitors comprises a first sampling capacitor having a first capacitance, and a second sampling capacitor having a second capacitance,
wherein, in the first mode, the SAR ADC is configured to receive the control signal having the first level from the mode controller, connect a first end of the second sampling capacitor to either of a first voltage and a second voltage that is different from the first voltage to convert the analog input signal into the digital output signal and switchably connect second ends of the first sampling capacitor and the second sampling capacitor to the analog input signal, and
wherein, in the second mode, the SAR ADC is configured to receive the control signal having the second level from the mode controller, disconnect the first end of the second sampling capacitor from either of the first voltage and the second voltage to convert the analog input signal into the digital output signal and switchably connect the second ends of the first sampling capacitor and the second sampling capacitor to the analog input signal.

2. The semiconductor device of claim 1, wherein the first capacitance of the first sampling capacitor is equal to the second capacitance of the second sampling capacitor.

3. The semiconductor device of claim 1, wherein the analog input signal has a first frequency in the first mode and has a second frequency in the second mode that is greater than the first frequency.

4. The semiconductor device of claim 1, wherein the plurality of variable sampling capacitors further comprises a plurality of first variable sampling capacitors, a bridge capacitor, and a plurality of second variable sampling capacitors,
wherein the plurality of first variable sampling capacitors has a binary-weighted structure, and
wherein the plurality of second variable sampling capacitors has a thermometer code structure.

5. The semiconductor device of claim 1, further comprising:
a first interlayer insulating film in which the first sampling capacitor is formed; and
a second interlayer insulating film in which the second sampling capacitor is formed,
wherein the second interlayer insulating film is disposed on the first interlayer insulating film.

6. The semiconductor device of claim 1, wherein the first capacitance is greater than the second capacitance.

7. The semiconductor device of claim 1, further comprising:
a decimation filter configured to filter the digital output signal in the first mode.

8. The semiconductor device of claim 1, wherein the plurality of variable sampling capacitors further comprises a plurality of first variable sampling capacitors, a bridge capacitor, and a plurality of second variable sampling capacitors, and
wherein the plurality of first variable sampling capacitors and the plurality of second variable sampling capacitors each has any one of a binary-weighted structure and a thermometer code structure.

9. The semiconductor device of claim 1, wherein the plurality of variable sampling capacitors has any one of a binary-weighted capacitor structure and a thermometer code structure.

10. A semiconductor device, comprising:
a comparator having an input node;
a successive approximation register (SAR) controller is configured to convert a first analog input signal into a first digital output signal under control of a control signal having a first level, by adjusting a voltage of the input node using a first sampling capacitor if an analog input signal is the first analog input signal, and convert a second analog input signal that is different from the first analog input signal into a second digital output signal under control of the control signal having a second level, the second level being different from the first level, by adjusting the voltage of the input node using a second sampling capacitor having a capacitance that is less than a capacitance of the first sampling capacitor if the analog input signal is the second analog input signal, wherein the analog input signal is switchably connected to the input node; and
a decimation filter configured to filter the first digital output signal and not filter the second digital output signal.

11. The semiconductor device of claim 10, wherein the first analog input signal has a first frequency, and
the second analog input signal has a second frequency that is greater than the first frequency.

12. The semiconductor device of claim 11, wherein the first sampling capacitor comprises a plurality of first sampling capacitors that has 2nC as a capacitance value, wherein n is a natural number a C is a rational number, and
the second sampling capacitor comprises a plurality of second sampling capacitors that has nC as a capacitance value.

13. The semiconductor device of claim 12, wherein the SAR controller is configured to connect each of the plurality of first sampling capacitors to any one of a first voltage and a second voltage that is different from the first voltage, if the first analog input signal is converted into the first digital output signal, and
connect each of the plurality of second sampling capacitors to any one of the first voltage and the second voltage, if the second analog input signal is converted into the second digital output signal.

14. The semiconductor device of claim 12, wherein the plurality of first sampling capacitors comprises a plurality of third sampling capacitors, a bridge capacitor, and a plurality of fourth sampling capacitors, wherein the third sampling capacitors have a binary-weighted structure, and wherein the fourth sampling capacitors have a thermometer code structure.

15. A semiconductor device, comprising:
a plurality of variable sampling capacitors, wherein each of the plurality of variable sampling capacitors comprises a first sampling capacitor having a first capacitance, and a second sampling capacitor having a second capacitance;
a comparator having a first input node connected to the plurality of variable sampling capacitors and a second input node connected to a comparison voltage;
a successive approximation register (SAR) controller configured to receive an output of the comparator, and connect each of the plurality of variable sampling capacitors to one of a first voltage and a second voltage that is different from the first voltage;
a decimation filter connected to the SAR controller; and
an output unit configured to output any one of an output of the decimation filter and an output of the SAR controller depending on a control signal.

16. The semiconductor device of claim 15, wherein the output unit comprises a multiplexer configured to output the output of the decimation filter if the control signal of a first level is applied, and output the output of the SAR controller if the control signal of a second that is level different from the first level is applied.

17. The semiconductor device of claim 15, wherein each of the plurality of variable sampling capacitors further comprises:
a first switching element configured to be controlled by a switching signal output from the SAR controller and connect the first sampling capacitor to one of the first voltage and the second voltage; and
a second switching element configured to be controlled by the switching signal and the control signal and connect the second sampling capacitor to one of the first voltage and the second voltage.

18. The semiconductor device of claim 17, further comprising:
an AND gate configured to perform an AND arithmetic operation of the switching signal and the control signal, and provide a result of the AND arithmetic operation to the second switching element.

19. The semiconductor device of claim 15, wherein the SAR controller is further configured to control each of the plurality of variable sampling capacitors so that the first sampling capacitor and the second sampling capacitor are each connected to one of the first voltage and the second voltage if the control signal of the first level is applied, and
control each of the plurality of variable sampling capacitors so that one of the first sampling capacitor and the second sampling capacitor is connected to one of the first voltage and the second voltage if the control signal of the second level that is different from the first level is applied.

* * * * *